United States Patent
Katakabe et al.

(10) Patent No.: US 6,558,478 B1
(45) Date of Patent: May 6, 2003

(54) METHOD OF AND APPARATUS FOR CLEANING SUBSTRATE

(75) Inventors: Ichiro Katakabe, Tokyo (JP); Shinya Morisawa, Tokyo (JP); Haruko Ohno, Tokyo (JP); Sachiko Kihara, Tokyo (JP); Akira Fukunaga, Tokyo (JP)

(73) Assignee: Ebara Corporation, Tokyo (JP)

( * ) Notice: Subject to any disclaimer, the term of this patent is extended or adjusted under 35 U.S.C. 154(b) by 16 days.

(21) Appl. No.: 09/679,305

(22) Filed: Oct. 6, 2000

(30) Foreign Application Priority Data

Oct. 6, 1999 (JP) .............................. 11-285419
Jan. 14, 2000 (JP) ........................... 2000-007094
Sep. 22, 2000 (JP) ........................... 2000-288215

(51) Int. Cl.⁷ .............................. B08B 3/02; B08B 7/00; H01L 21/00
(52) U.S. Cl. ................................ 134/33; 134/2; 134/3; 134/28; 134/36; 134/41
(58) Field of Search ................................ 134/3, 33, 36, 134/41, 902, 26, 28, 29, 2; 438/906; 216/101, 106, 107

(56) References Cited

U.S. PATENT DOCUMENTS

| | | | | |
|---|---|---|---|---|
| 5,487,398 A | * | 1/1996 | Ohmi et al. | 134/102.2 |
| 5,489,557 A | * | 2/1996 | Jolley | 134/28 |
| 5,681,398 A | * | 10/1997 | Muraoka | 134/28 |
| 5,897,379 A | | 4/1999 | Ulrich et al. | |
| 6,053,984 A | * | 4/2000 | Petvai et al. | 134/2 |
| 6,099,662 A | * | 8/2000 | Wang et al. | 134/26 |
| 6,230,720 B1 | * | 5/2001 | Yalamanchili et al. | 134/1.3 |
| 6,348,157 B1 | * | 2/2002 | Ohmi et al. | 134/1.3 |

FOREIGN PATENT DOCUMENTS

| | | |
|---|---|---|
| JP | 2776583 | 5/1991 |
| JP | 6-314679 | 11/1994 |
| JP | 8-250460 | 9/1996 |
| JP | 9-186120 | 7/1997 |
| JP | 10-312981 | 11/1998 |
| JP | 11-186218 | 7/1999 |
| WO | 00/32835 | 6/2000 |

OTHER PUBLICATIONS

Ichiro Katakabe et al., "Edge controll and surface protection with two nozzles Construct total system for Cu plating deposition", Electronic Journal, pp. 104–105, Jan. 15, 2000.

Toru Hara et al., "Cleaning backside and sidewall of Cu interconnection wafer by CSE (Chemical Spin Etching)", Semiconductor World, vol. 18 No. 4, Mar. 20, 1999.

Patrick S. Lysaght et al., "Addressing Cu contamination via spin–etch cleaning", Solid State Technology, pp. 63–70, Nov. 1999.

* cited by examiner

*Primary Examiner*—Randy Gulakowski
*Assistant Examiner*—Saeed Chaudhry
(74) *Attorney, Agent, or Firm*—Wenderoth, Lind & Ponack, L.L.P.

(57) ABSTRACT

An acid solution is continuously supplied to a central portion of a surface of a substrate while the substrate is rotating, and an oxidizing agent solution is continuously or intermittently supplied to a periphery of the substrate. In addition, an oxidizing agent solution and an acid solution are simultaneously or alternately supplied to a reverse side of the substrate.

30 Claims, 9 Drawing Sheets

METHOD OF AND APPARATUS FOR CLEANING SUBSTRATE

BACKGROUND OF THE INVENTION

1. Field of the Invention

The present invention relates to a method of and an apparatus for cleaning a substrate, and more particularly to a method of and an apparatus for cleaning a semiconductor wafer or the like to remove an unwanted interconnection material such as copper (Cu) or the like that has been attached to a periphery and a reverse side of the substrate upon growth of a film on the substrate.

2. Description of the Related Art

More attempts are being made to use copper, which has a low electric resistivity and is highly resistant to electromigration, as a metal material for forming interconnections on a semiconductor substrate, rather than aluminum and aluminum alloys. Copper interconnections are generally formed by embedding copper in minute recesses defined in a surface of the semiconductor substrate. CVD, sputtering, and plating processes are used to form copper interconnections. According to any of these processes, a copper film is deposited on the entire surface of the semiconductor substrate, including its periphery, or on the surface of the semiconductor substrate while sealing its periphery, and thereafter unwanted deposited copper is removed from the semiconductor substrate by chemical mechanical polishing (CMP). In this copper film growth process, when the sealing is incomplete, the copper film is deposited on a periphery, i.e. edge of the substrate, and a sputtered film of copper is attached to a reverse side of the substrate.

On the other hand, copper can easily be diffused into a silicon oxide film during a semiconductor fabrication process, thereby impairing electric insulation of the silicon oxide film. Thus, the remaining unnecessary copper needs to be completely removed from the substrate. Furthermore, the copper deposited upon film growth on the periphery (edge and beveled surface) of the substrate other than a circuit area is not only unnecessary, but may cause cross contamination in subsequent processes of delivering, storing, and processing the substrate. For these reasons, it is necessary that the remaining deposited copper on the periphery of the substrate be completely removed immediately after the copper film growing process or the CMP process.

Various efforts have been proposed to remove unwanted copper deposits from semiconductor substrates. According to one attempt, while a substrate with a protective coating on a surface of a copper film on an upper circuit region is being rotated in a horizontal plane, a periphery of the substrate is supplied with a copper etching solution to dissolve and remove copper attached to the periphery of the substrate. Another proposed effort is concerned with a process of immersing a substrate with a protective coating in an acid solution to etch away a metal film formed on a periphery of the substrate.

However, while conventional copper removal processes are capable of removing unwanted copper deposits from the periphery of substrates, they cannot remove a natural oxide film formed on a surface of copper on a circuit, which needs to be removed separately, and they fail to remove copper deposits from a reverse side of the substrate simultaneously with the removal of copper deposits from the surface on which the circuit is formed. Copper deposits are removed from a periphery of the substrate over different widths (edge cutting widths) depending on the purpose for which the substrate will be used. Since the conventional copper removal processes fail to set the edge cutting width to freely selected values, they cannot handle a wide variety of types of substrates. This problem holds true for other interconnection materials including tungsten, ruthenium, various silicides, and additional materials other than copper and electrode materials.

SUMMARY OF THE INVENTION

It is therefore an object of the present invention to provide a method of and an apparatus for cleaning a substrate to reliably remove an interconnection material such as copper from a periphery and a reverse side of the substrate while removing a natural oxide film formed on a surface of copper on a circuit of the substrate, and allowing an edge cutting width to be set to a freely selected value.

According to the present invention, there is provided a method of cleaning a substrate, comprising: supplying an acid solution to a central portion of a surface of a substrate while rotating the substrate; and supplying an oxidizing agent solution to a periphery of the substrate.

Any natural oxide film of copper, for example, formed on a circuit area on the surface of the substrate is removed, and hence prevented from growing, by the acid solution which is supplied to the central portion of the surface of the substrate and spreads over the entire surface of the substrate. A copper film, for example, attached to the periphery of the substrate is oxidized by the oxidizing agent solution, and etched away and dissolved by the acid solution.

The method further comprises supplying an oxidizing agent solution and an acid solution to a reverse side of the substrate. Copper, for example, attached to the reverse side of the substrate, together with silicon of the substrate, is oxidized by the oxidizing agent solution and etched away by the acid solution. The copper is removed from the reverse side of the substrate simultaneously with the removal of the film of copper from the surface of the substrate.

The oxidizing agent solution and the acid solution may be supplied from respective different nozzles to the reverse side of the substrate. If the supply of the oxidizing agent solution is stopped first, then a hydrophobic surface is produced on the reverse side of the substrate. If the supply of the acid solution is stopped first, then a hydrophilic surface is produced on the reverse side of the substrate. Therefore, the reverse side of the substrate can be adjusted to meet a subsequent process requirement.

The acid solution comprises at least one of hydrochloric acid, hydrofluoric acid, sulfuric acid, citric acid, and oxalic acid.

The oxidizing agent solution comprises at least one of ozone, hydrogen peroxide, nitric acid, and hypochlorous acid.

According to the present invention, there is also provided an apparatus for cleaning a substrate, comprising: a substrate holder for holding and rotating a substrate; a central nozzle disposed above a central portion of a surface of the substrate which is held by the substrate holder; and an edge nozzle disposed above the substrate which is held by the substrate holder. The edge nozzle is movable from a periphery of the substrate toward the central portion thereof and/or vertically with respect to the surface of the substrate. For supplying the acid solution from the central nozzle and the oxidizing agent solution from the edge nozzle to etch a periphery of the substrate, the position and/or height of the edge nozzle can be varied to set an edge cutting width freely.

The edge nozzle is adjustable to vary an angle between solution ejected from the edge nozzle and the surface of the substrate.

The edge nozzle is adjustable to vary an angle between an extension line, of a line defined as projection of the solution ejected from the edge nozzle onto the surface of the substrate, and a line tangent to an outer circumference of the substrate at an intersection point with the extension line.

The orientation of the edge nozzle with respect to the surface of the substrate can be selected as desired to change the direction in which the solution ejected from the edge nozzle is applied to the surface of the substrate, for thereby preventing the solution from being scattered around and thus achieving a good etching configuration.

According to the present invention, there is provided a method of cleaning a substrate having a circuit on which copper is deposited, comprising: supplying an acid solution to a central portion of a surface of the substrate and spreading the acid solution over the entire surface of the substrate while rotating the substrate; and dissolving away oxidized copper on upper and outer peripheral surfaces of a periphery of the substrate.

The acid solution comprises non-oxidizing acid. The non-oxidizing acid comprises at least one of hydrochloric acid, hydrofluoric acid, sulfuric acid, citric acid, and oxalic acid.

The oxidizing agent solution comprises at least one of ozone, hydrogen peroxide, nitric acid, and hypochlorous acid.

The method further comprises supplying an oxidizing agent solution to a reverse side of the substrate that is opposite to the surface of the substrate.

According to the present invention, there is provided an apparatus for cleaning a substrate having a circuit on which copper is deposited, comprising: a substrate holder for holding and rotating a substrate; a central nozzle for supplying an acid solution to a central portion of a surface of the substrate which is held by the substrate holder; and an edge nozzle for supplying an oxidizing agent solution to a periphery of the substrate.

According to the present invention, there is provided a plating apparatus for plating a surface of a substrate with metal in a housing unit. The plating apparatus comprises: a cassette stage for placing a substrate cassette thereon; a plating unit for plating the surface of the substrate; and a first cleaning apparatus for cleaning the plated substrate at least by an acid solution. The first cleaning apparatus comprises a substrate holder for holding and rotating the substrate, a central nozzle for supplying an acid solution to a central position of the surface of the substrate held by the substrate holder, and an edge nozzle for supplying an oxidizing agent solution to a periphery of the surface of the substrate. The plating apparatus further comprises: a second cleaning apparatus for cleaning the plated substrate with pure water; and a transfer device for transferring the substrate.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figures 1, 2:
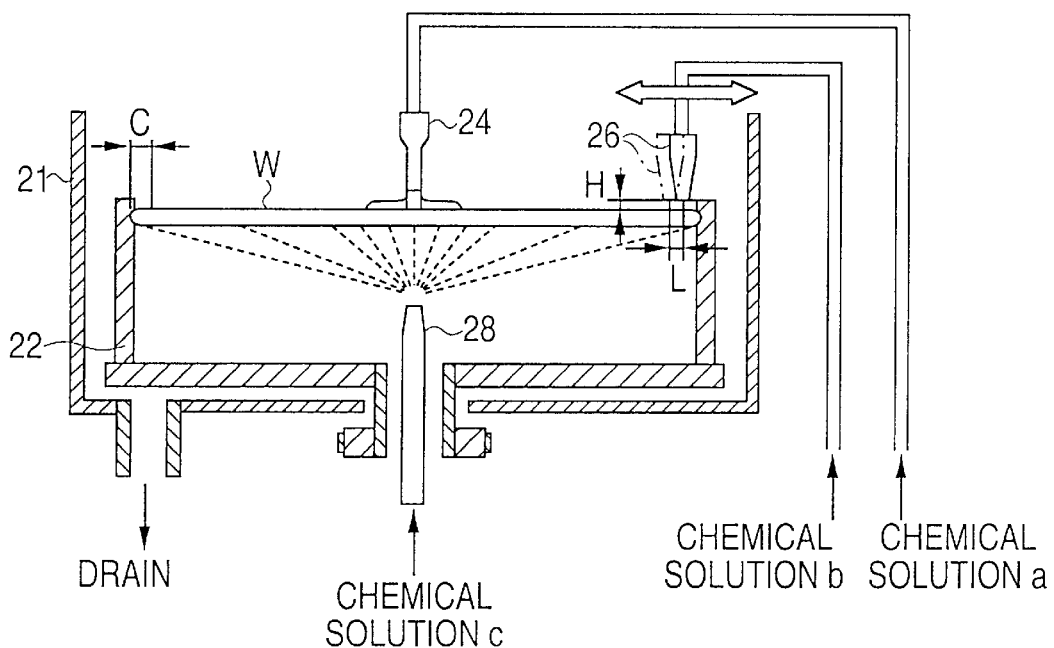
FIG. 1 is a vertical cross-sectional view of an apparatus for carrying out a method of cleaning a substrate according to the present invention.
FIG. 2 is a vertical cross-sectional view of an apparatus for cleaning a substrate according to the present invention.

FIG. 1 shows an apparatus for carrying out a method of cleaning a substrate according to the present invention. As shown in FIG. 1, a substrate W such as a semiconductor wafer which has a circuit area on its surface, except a periphery thereof, is gripped by a plurality of spin chucks 12 spaced along the periphery and held horizontally by a substrate holder 10. The substrate W thus held by the substrate holder 10 can be rotated in a horizontal plane at a high speed. The substrate W may alternatively be held vertically by a substrate holder mechanism. A central nozzle 14 that is directed downwardly is positioned above a substantially central portion of the surface of the substrate W held by the substrate holder 10. An edge nozzle 16 that is directed downwardly is positioned above the periphery of the substrate W. Two back nozzles 18, 20 that are directed upwardly are positioned below a substantially central portion of a reverse side of the substrate W.

Herein, the periphery of the substrate is defined as an area where the circuit is not formed at a peripheral portion of the substrate, or an area where even if the circuit is formed at a peripheral portion of the substrate, a semiconductor device is not used as a final product. The central nozzle 14 may be disposed at a desired position between the central portion and the periphery of the surface of the substrate. However, liquid from the nozzle 14 is supplied to the central portion of the substrate. The central portion of the substrate is preferably an area corrresponding to 20% or less of the diameter of the substrate, and more preferably an area of 10% or less of the diameter of the substrate. Similarly, the back nozzle 18 may be disposed at a desired position between the central portion and the periphery of the reverse side of the substrate. However, it is desirable that liquid from the back nozzle 18 is supplied to the central portion of the substrate.

Each of these nozzles may comprise a plurality of nozzles depending on how the substrate W is to be cleaned. A fixed nozzle (not shown) may be mounted on an inner side surface of the apparatus, such as an inner side surface of a water-resistant cover 21 shown in FIG. 2, and deionized water, pure water or a chemical solution such as an acid solution, an alkaline solution, a surface active agent, a corrosion-resistant agent, or the like may be supplied from the fixed nozzle to the substrate.

The method of cleaning a substrate carried out by the apparatus shown in FIG. 1 will be described below. Herein, copper is used as interconnection material.

The substrate W is gripped by the spin chucks 12 and held horizontally by the substrate holder 10, and then rotated with the substrate holder 10 in the horizontal plane. While the substrate W is being rotated, an acid solution is supplied from the central nozzle 14 to the central portion of the surface of the substrate W, and spreads over the entire surface of the substrate W under centrifugal forces. Any natural oxide film of copper formed on the circuit area on the surface of the substrate W is immediately removed by the acid solution, and hence prevented from growing on the surface of the substrate W. The acid solution may comprise hydrochloric acid, hydrofluoric acid, sulfuric acid, citric acid, oxalic acid, or a combination thereof which is generally used in a cleaning process of a semiconductor fabrication process. The acid solution may comprise any acid insofar as it is a non-oxidizing acid. The acid solution of hydrofluoric acid is preferable because it can also be used to clean the reverse side of the substrate W and thus reduce the amount of chemicals used. Further, in case of hydrofluoric acid, the hydrofluoric acid concentration is preferably 0.1% or more by weight in order to remove oxide film, and preferably 5% or less by weight in order not to roughen the surface of copper.

An oxidizing agent solution is continuously or intermittently supplied from the edge nozzle 16 to the periphery of the substrate W. A copper film grown on upper and outer peripheral surfaces of the periphery of the substrate W is quickly oxidized by the oxidizing agent solution, and at the same time etched away and dissolved away by the acid solution which is supplied from the central nozzle 14 and spreads over the entire surface of the substrate W. Because the copper film is etched at a point other than where the oxidizing agent solution is supplied, the concentration and the amount of the oxidizing agent solution do not need to be high. The oxidizing agent solution may comprise ozone, hydrogen peroxide, nitric acid, hypochlorous acid, or a combination thereof which is generally used in a cleaning process of a semiconductor fabrication process. If ozone water is used, then ozone should preferably be contained in 20 ppm or more and 200 ppm or less. If hydrogen preoxide is used, then it should preferably be contained in 10% or more by weight and 80% or less by weight. If hypochlorous acid is used, then it should preferably be contained in 1% or more by weight and 50% or less by weight.

At the same time, an oxidizing agent solution and an acid solution such as hydrofluoric acid are simultaneously or alternately supplied from the back nozzles 18, 20 to the central portion of the reverse side of the substrate W. Copper attached to the reverse side of the substrate W, together with silicon of the substrate W, is oxidized by the oxidizing agent solution and etched away by the acid solution.

The oxidizing agent solution and the acid solution may be simultaneously or alternately supplied from the respective two back nozzles 18, 20. If the supply of the oxidizing agent solution is stopped first, then a hydrophobic surface is produced on the reverse side of the substrate W. If the supply of the acid solution is stopped first, then a hydrophilic surface is produced on the reverse side of the substrate W. Therefore, the reverse side of the substrate W can be adjusted to meet a subsequent processing requirement.

The oxidizing agent solution may comprise ozone, hydrogen peroxide, nitric acid, hypochlorous acid, or a combination thereof The acid solution comprises non-oxidizing acid such as hydrochloric acid, hydrofluoric acid, sulfuric acid, citric acid, oxalic acid, or a combination thereof. It is possible to use oxidizing acid such as nitric acid as the acid solution for thereby removing copper, because there is no circuit on the reverse side of the substrate, differently from the surface of the substrate. If oxidizing acid solution such as nitric acid is used as the acid solution, it is possible to use the acid solution singly without using the oxidizing agent solution, because oxidizing acid solution itself serves as the oxidizing agent solution. It is preferable for the back nozzle 18 to supply the same oxidizing agent solution as the oxidizing agent solution supplied to the periphery of the substrate W because the number of chemicals used is reduced.

FIGS. 2 through 7 show an apparatus for cleaning a substrate according to the present invention. As shown in FIG. 2, the apparatus includes a substrate holder 22 disposed in a bottomed cylindrical water-resistant cover 21 for horizontally holding a substrate W face up with spin chucks, and rotating the substrate W at a high speed. The apparatu also includes a central nozzle 24 directed downwardly and positioned above a substantially central portion of the surface of the substrate W held by the substrate holder 22, an edge nozzle 26 directed downwardly and positioned above a periphery of the substrate W, and a back nozzle 28 directed upwardly and positioned below a substantially central portion of the reverse side of the substrate W.

Figure 3:
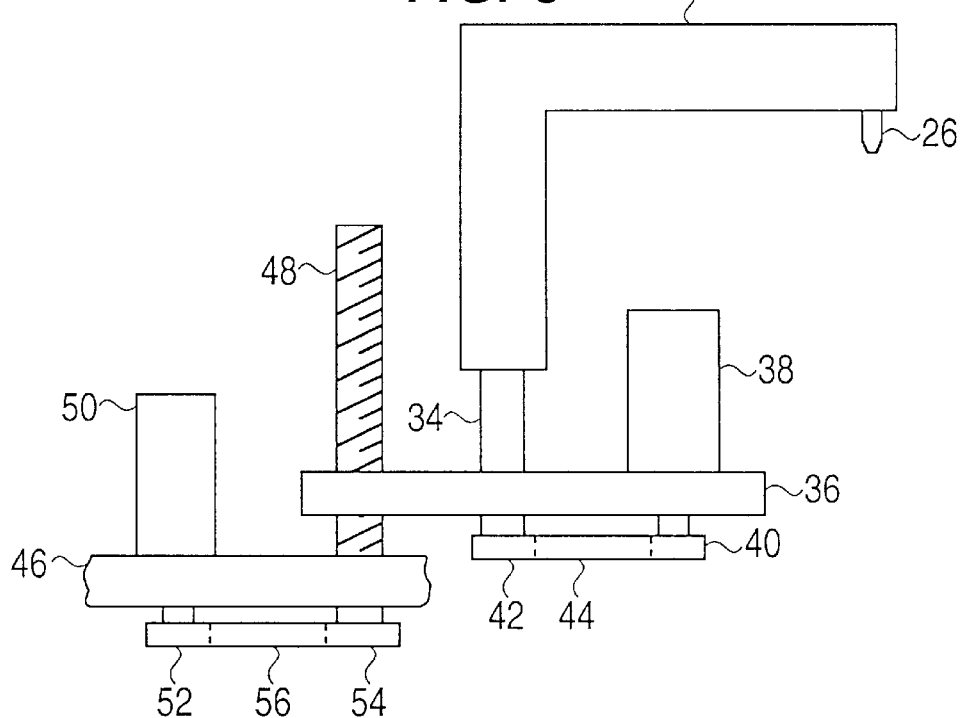
FIG. 3 is a side elevational view of an edge nozzle actuating mechanism.
Figure 6:
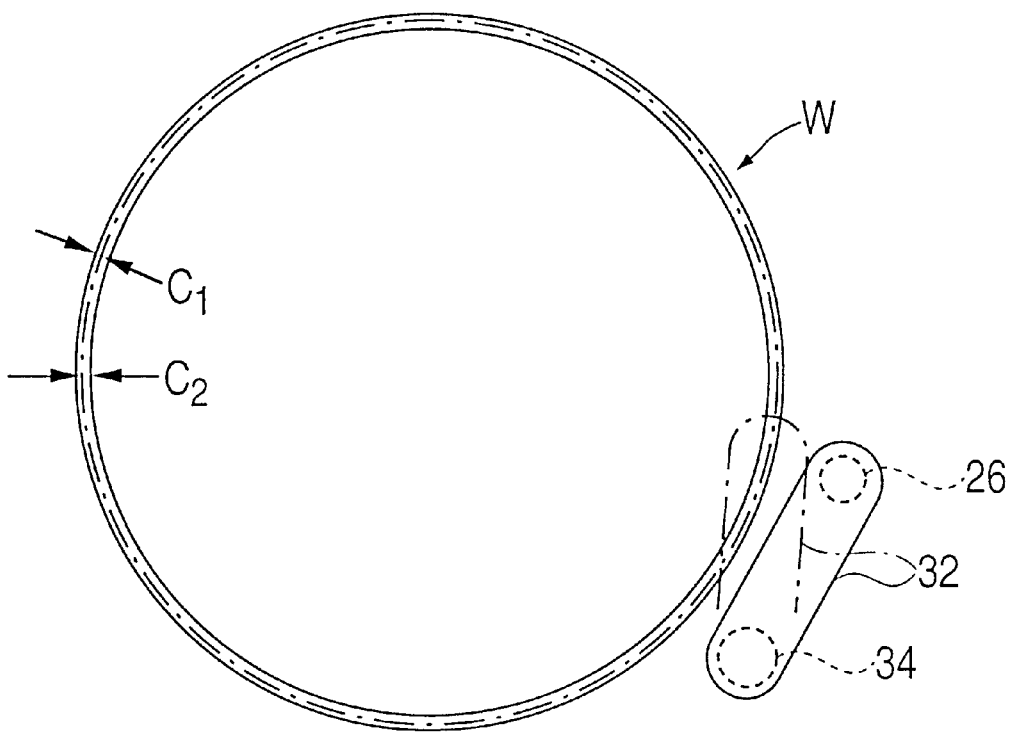
FIG. 6 is a plan view of a substrate, showing an edge cutting width thereof.
Figure 7:
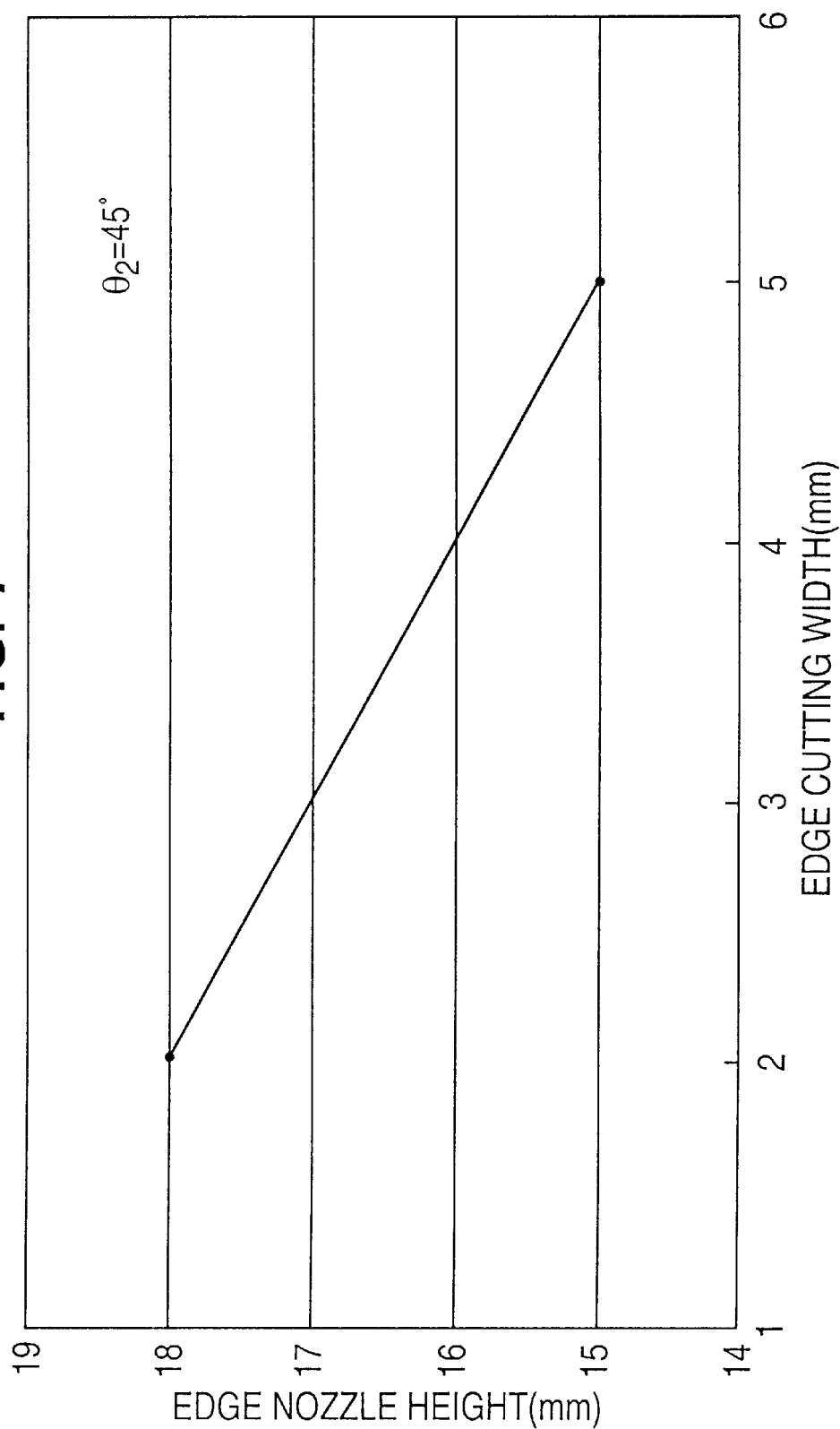
FIG. 7 is a graph showing the relationship between an edge nozzle height and an edge cutting width at a time when an angle of a liquid ejected from the edge nozzle relative to the substrate surface is set to 45°.

As shown in FIG. 3, the edge nozzle 26 is fixedly mounted on a free end of a swing arm 32 that extends horizontally. A vertically extending arm shaft 34 is joined to a proximal end of the swing arm 32 and rotatably supported on a stage 36. The stage 36 supports a motor 38 for actuating the swing arm 32. The motor 38 has an output shaft on which a drive pulley 40 is mounted. The arm shaft 34 has a lower end projecting downwardly from the stage 36 and supporting a driven pulley 42. A timing belt 44 is trained around the drive pulley 40 and the driven pulley 42. As shown in FIG. 6, the swing arm 32 is positioned laterally of the substrate W that is held by the substrate holder 22. When the motor 38 is energized, the swing arm 32 is angularly moved about the arm shaft 34 to displace the edge nozzle 26 from the periphery of the substrate W radially toward the central portion of the substrate W. Distance L (see FIG. 2) that the edge nozzle 26 is displaced radially of the substrate W can be controlled by controlling a number of pulses applied to the motor 38.

An externally threaded screw rod 48 is rotatably supported vertically on a mount base 46 and engaged with an internally threaded hole defined in the stage 36. The mount base 46 supports thereon a motor 50 having an output shaft on which a drive pulley 52 is mounted. The screw rod 48 has a lower end projecting downwardly from the mount base 46 and supporting a driven pulley 54. A timing belt 56 is trained around the drive pulley 52 and the driven pulley 54. When the motor 50 is energized, the screw rod 48 is rotated about its own axis to move the edge nozzle 26 vertically together with the stage 36. Height H (see FIG. 2) from the surface of the substrate W to a lower end of the edge nozzle 26 can be controlled by controlling a number of pulses applied to the motor 50.

Figure 4:
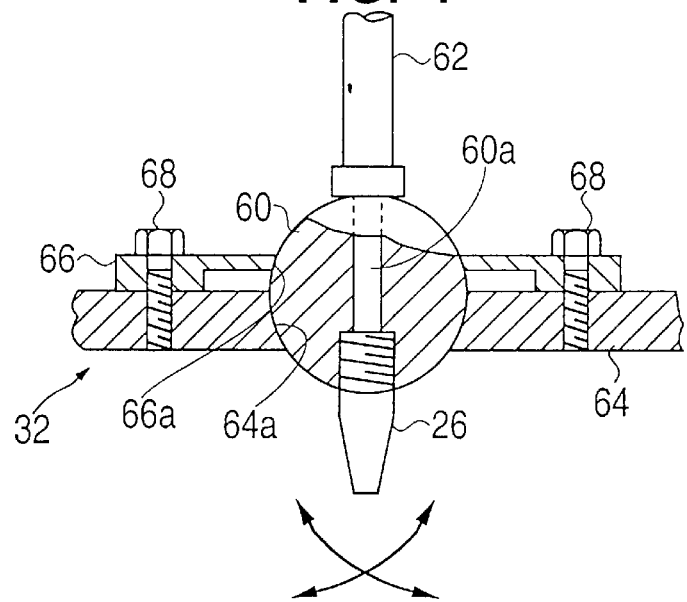
FIG. 4 is a cross-sectional view of an edge nozzle fixing unit.

As shown in FIG. 4, the edge nozzle 26 is connected to a ball 60 having a chemical passage 60a defined therein which is connected to a chemical tube 62. The ball 60 is gripped between a frame plate 64 of the swing arm 32 and an attachment plate 66 that is fastened to the frame plate 64 by bolts 68. The frame plate 64 and the attachment plate 66 have respective through holes 64a, 66a defined therein by partly spherical surfaces which are complementary in shape and held in abutment against a spherical surface of the ball 60. When the bolts 68 are loosened, the ball 60 freely rotates in the through holes 64a, 66a in the frame plate 64 and the attachment plate 66 for thereby directing the edge nozzle 26 as desired. When the edge nozzle 26 is directed as desired, the bolts 68 are tightened to grip the ball 60 with the frame plate 64 and the attachment plate 66.

Figure 5A:
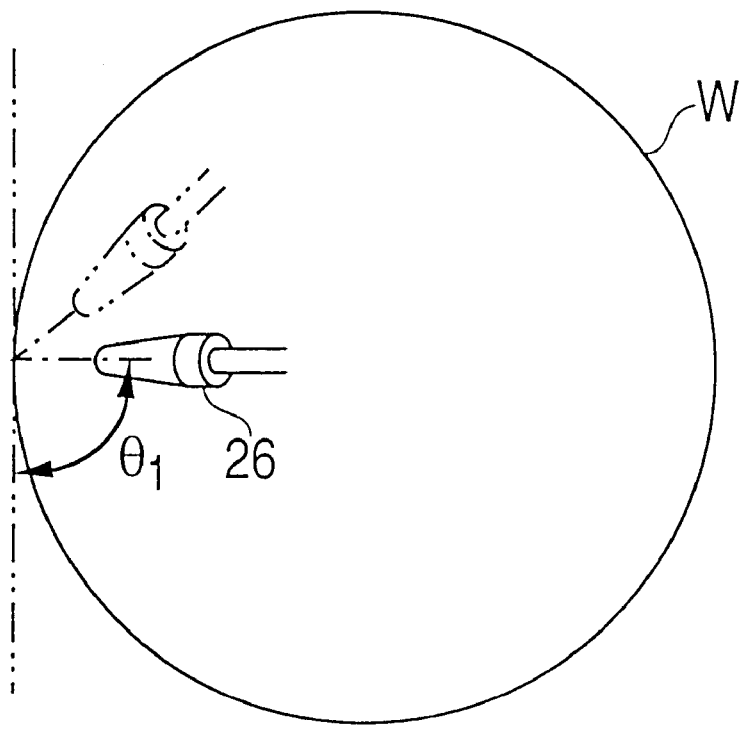
FIGS. 5A and 5B are views illustrative of the orientation (angle) of an edge nozzle with respect to a substrate surface.
Figure 5B:
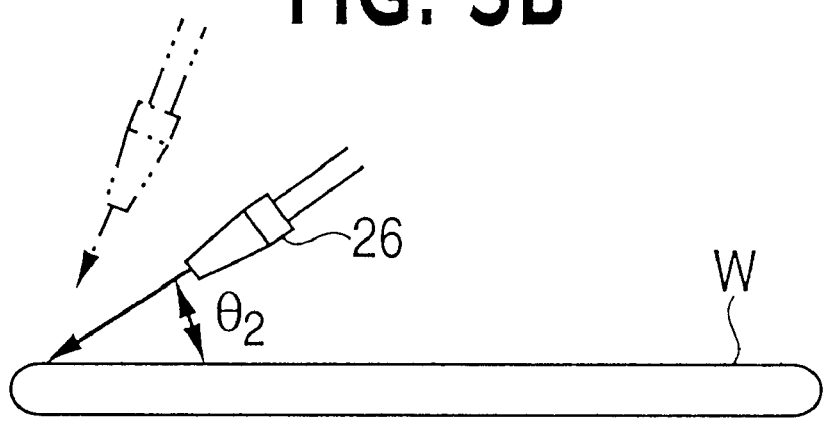

FIG. 5A shows an angle $\theta_1$, formed between an extension line, of a line defined as projection of liquid ejected from the edge nozzle 26 onto the surface of the substrate W, and a line tangent to an outer circumference of the substrate W at an intersection point with the extension line. FIG. 5B shows an angle $\theta_2$ formed between the liquid ejected from the edge nozzle 26 and the surface of the substrate W. By orienting the edge nozzle 26 as described above, the angles $\theta_1$, $\theta_2$ can easily be adjusted to prevent the liquid ejected from the edge nozzle 26 from being scattered from the periphery of the substrate W and also to produce a good etching configuration. The angle $\theta_1$ can be adjusted in a range from 0 to 180°, preferably from 70 to 110°, and more preferably from 80 to 100°. The angle $\theta_2$ can be adjusted in the range from 0 to 90°, preferably from 10 to 60°, and more preferably from 35 to 55°.

If the edge nozzle 26 is oriented obliquely with respect to the surface of the substrate W, then an edge cutting width C (see FIG. 2) can be varied by varying the height H of the edge nozzle 26. For example, if the edge cutting width C is 5 mm when the angle $\theta_2$ is 45° and the height H is 15 mm, then the edge cutting width C can be reduced by 1 mm by increasing the height H by 1 mm. Therefore, insofar as the substrate W is rotated at a speed large enough to prevent the liquid from sneaking from the reverse side to the surface of the substrate W, then the edge cutting width C can be determined only by varying the height H of the edge nozzle 26. The edge cutting width C can be set freely in a range of edge cutting widths from $C_1$ to $C_2$ (i.e. 2 mm to 5 mm), shown in FIG. 6, for removing a copper film present within the edge cutting width C. If the edge nozzle 26 is oriented vertically, as shown in FIG. 2, the edge cutting width C may be adjusted as described above based on the distance L that the edge nozzle 26 is displaced radially of the substrate W.

Figure 8:
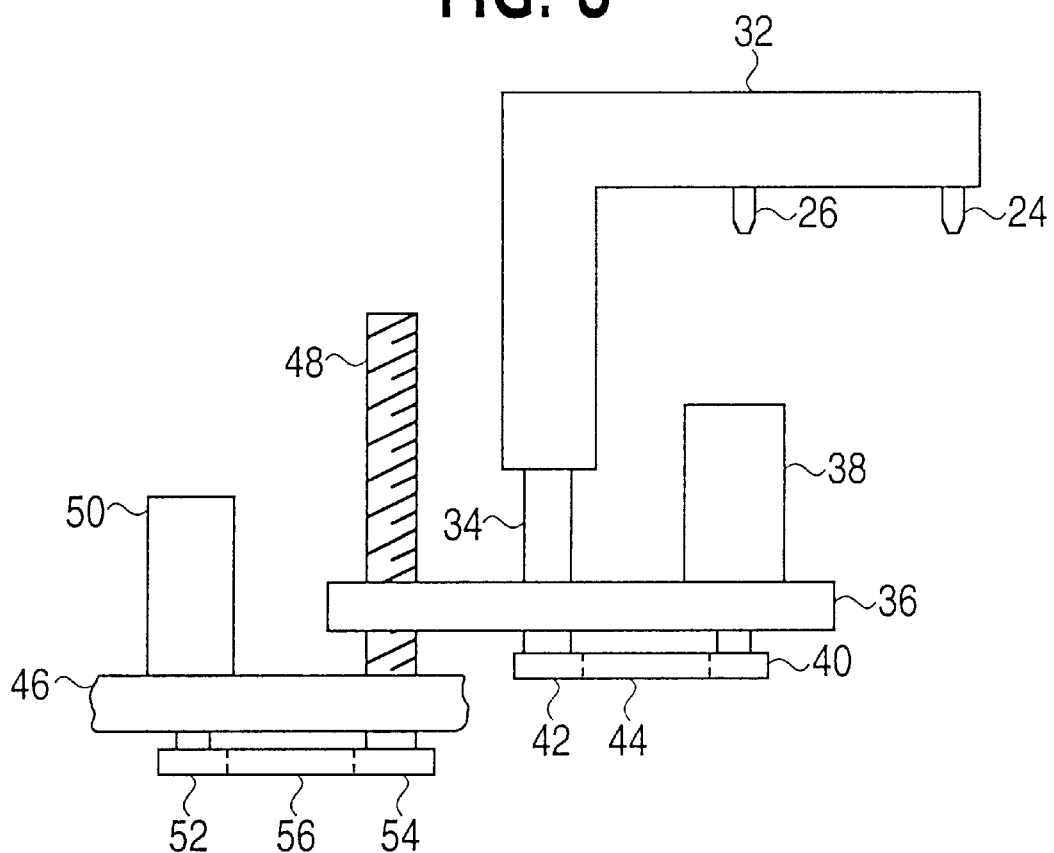
FIG. 8 is a side elevational view of a modified edge nozzle actuating mechanism.

As shown in FIG. 8, the central nozzle 24 may be mounted on the free end of the swing arm 32, and the edge nozzle 26 may be mounted on a longitudinally intermediate portion of the swing arm 32. With the modification shown in FIG. 8, when the swing arm 32 is moved, both the central nozzle 24 and the edge nozzle 26 are simultaneously moved.

An example of usage of the substrate cleaning apparatus will be described below. The edge nozzle 26 is positionally adjusted such that the height H of the edge nozzle 26 from the surface of the substrate W is 15 mm, the angle $\theta_2$ formed between the liquid ejected from the edge nozzle 26 and the surface of the substrate W is 45°, and the angle $\theta_1$ formed between the extension line, of the line defined as the projection of the liquid ejected from the edge nozzle 26 onto the surface of the substrate W, and the line tangent to the outer circumference of the substrate W at the intersection point with the extension line is 90°, and the edge cutting width C is set depending on the size of the substrate W and a purpose for which the substrate W will be used. The edge cutting width C can easily be varied or adjusted by varying the height H of the edge nozzle 26 from the surface of the substrate W. The height H and the angles $\theta_1$, $\theta_2$ can be set to desired values depending on the size of the substrate W and the purpose for which the substrate W will be used.

The substrate W is then held horizontally by the substrate holder 22, and rotated with the substrate holder 22 in a horizontal plane. DHF (diluted fluoroboric acid), for example, is continuously supplied from the central nozzle 24 to the central portion of the surface of the substrate W, and $H_2O_2$, for example, is continuously or intermittently supplied from the edge nozzle 26 to the periphery of the substrate W.

Within an area (edge and beveled surface) in the edge cutting width C on the periphery of the substrate W, a mixed solution of HF and $H_2O_2$ is produced, thereby rapidly etching away copper on the surface of the substrate W. A mixed solution of HF and $H_2O_2$ may be supplied from the edge nozzle to the periphery of the substrate W for thereby etching copper on the periphery of the substrate W. However, as described above, if HF supplied from the center nozzle 24 and $H_2O_2$ supplied from the edge nozzle 26 are mixed on the periphery of the substrate W, then a steeper etching profile can be achieved as compared to a mixed solution of HF and $H_2O_2$ supplied from the edge nozzle 26, for example. The DHF supplied from the central nozzle 24 serves as a protective film for the surface of a copper-plated film. The concentration of DHF and $H_2O_2$ determines an etching rate for copper.

After the supply of DHF from the central nozzle 24 is stopped, the supply of $H_2O_2$ from the edge nozzle 26 is stopped. In this manner, Si exposed on the surface of the substrate W is oxidized to suppress deposition of copper on the surface of the substrate W.

Simultaneously, chemical solutions, $H_2O_2$ and DHF, for example, are separately supplied from the back nozzle 28 in the order of $H_2O_2$ and DHF. Hence, copper attached to the reverse side of the substrate W is oxidized by $H_2O_2$ and etched away by DHF, so that copper contamination on the reverse side of the substrate W can be removed.

The substrate W is then rinsed with deionized water supplied from one or more fixed nozzles (not shown) provided at an inner surface of the cover 21. Alternatively, the substrate W may be rinsed with deionized water supplied from the center nozzle 24 and the back nozzle 28. In this case, the chemical solution supplied from the center nozzle 24 and the back nozzle 28 should be changed to deionized water. Thereafter, the substrate W is spin-dried, whereupon the cleaning of the substrate W is completed. The copper film present in the edge cutting width C on the periphery (edge and beveled surface) of the surface of the substrate W, and copper contamination on the reverse side of the substrate W can simultaneously be removed within 80 seconds, for example.

Figure 9:
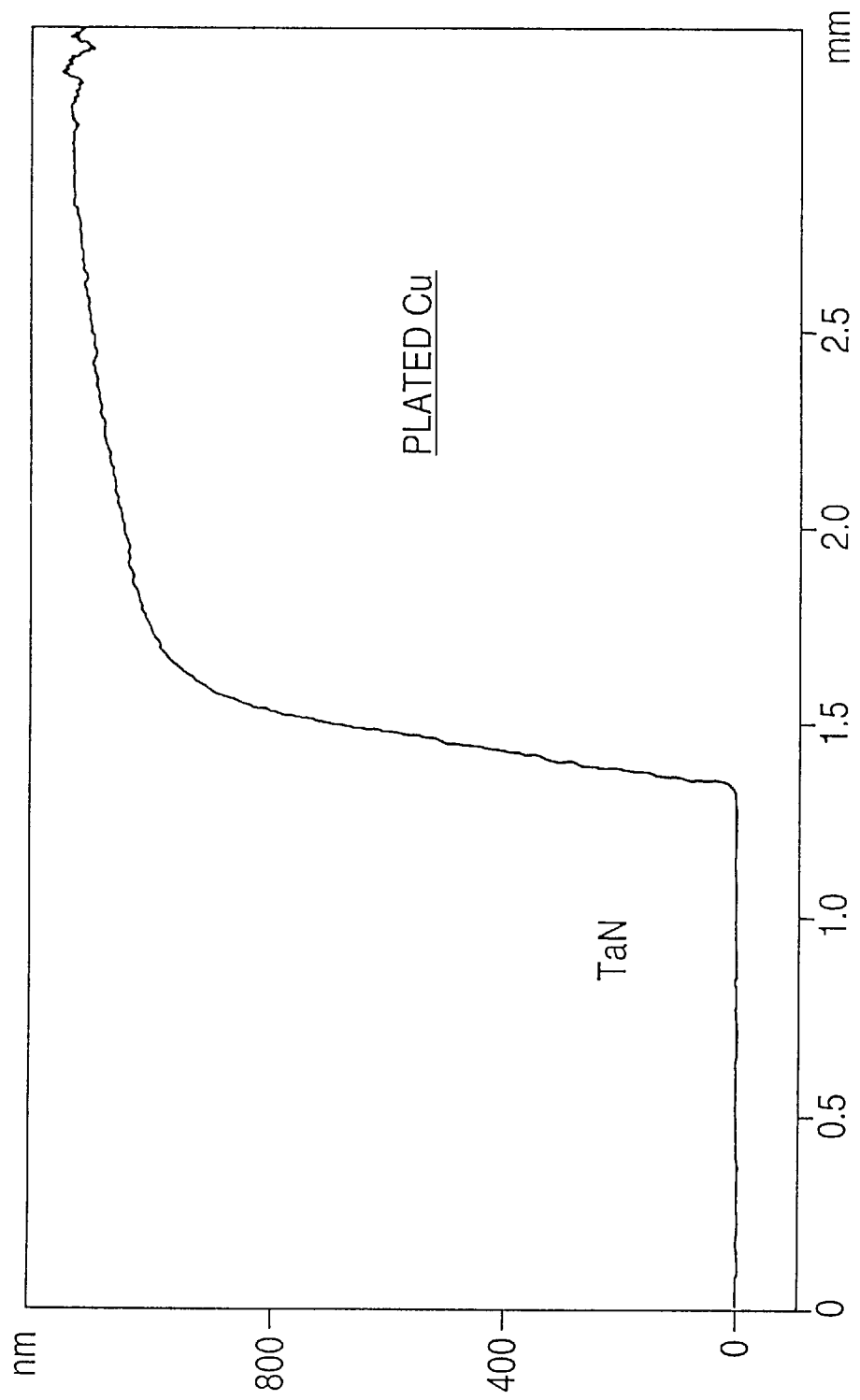
FIG. 9 is a diagram showing an etching profile of a substrate surface processed according to the present invention.

FIG. 9 shows an etching profile of the surface of the substrate W thus processed. It can be seen from FIG. 9 that on the periphery of the substrate W, the copper film is completely removed, exposing a TaN film on the surface, and a good steep boundary profile can be achieved.

Figure 10:
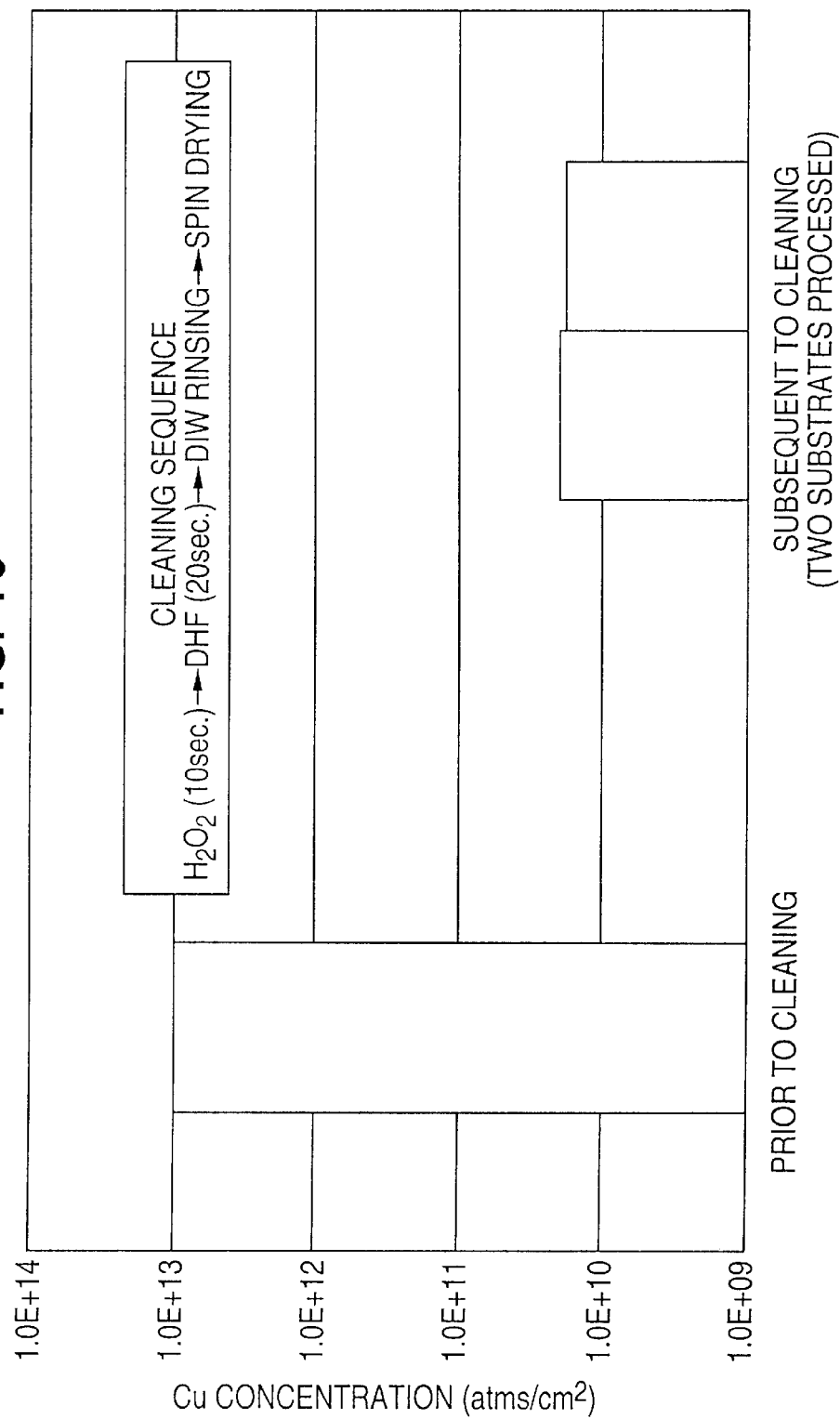
FIG. 10 is a diagram showing the result of a cleaning process effected on a reverse side of a substrate.

FIG. 10 shows the result of the above cleaning process effected on the reverse side of a silicon wafer which has been contaminated with a dilute solution of $CuSO_4$ at a rate of 1.0e13 atoms/cm². A study of FIG. 10 indicates that concentration of the contamination can be removed on the order of 1.0e13 atoms/cm².

In this manner, the copper film on the periphery (edge and beveled surface) of the surface of the substrate can be removed, and the copper contamination on the reverse side of the substrate can be reduced to a level at which it causes no problems.

While copper is used as an interconnection material in the above embodiment, the present invention is also applicable to interconnection materials including tungsten, ruthenium, various suicides, and additional materials other than copper and electrode materials.

With the above arrangement of the present invention, any natural oxide film of copper formed on the circuit area on the surface of the substrate is removed by the acid solution, and copper attached to the periphery of the substrate is oxidized by the oxidizing agent solution, and etched away and dissolved by the acid solution. Thus, it is not necessary to separately remove a natural oxide film growing on the surface of the substrate.

By simultaneously or alternately supplying the oxidizing agent solution and the acid solution to the reverse side of the substrate, copper attached to the reverse side of the substrate can be etched away at the same time that copper is etched away from the surface of the substrate.

For supplying the acid solution from the central nozzle and the oxidizing agent solution from the edge nozzle to etch the periphery of the substrate, the edge nozzle can be moved to adjust the edge cutting width freely. Therefore, the substrate cleaning apparatus can handle a wide variety of types of substrates.

Figure 11:
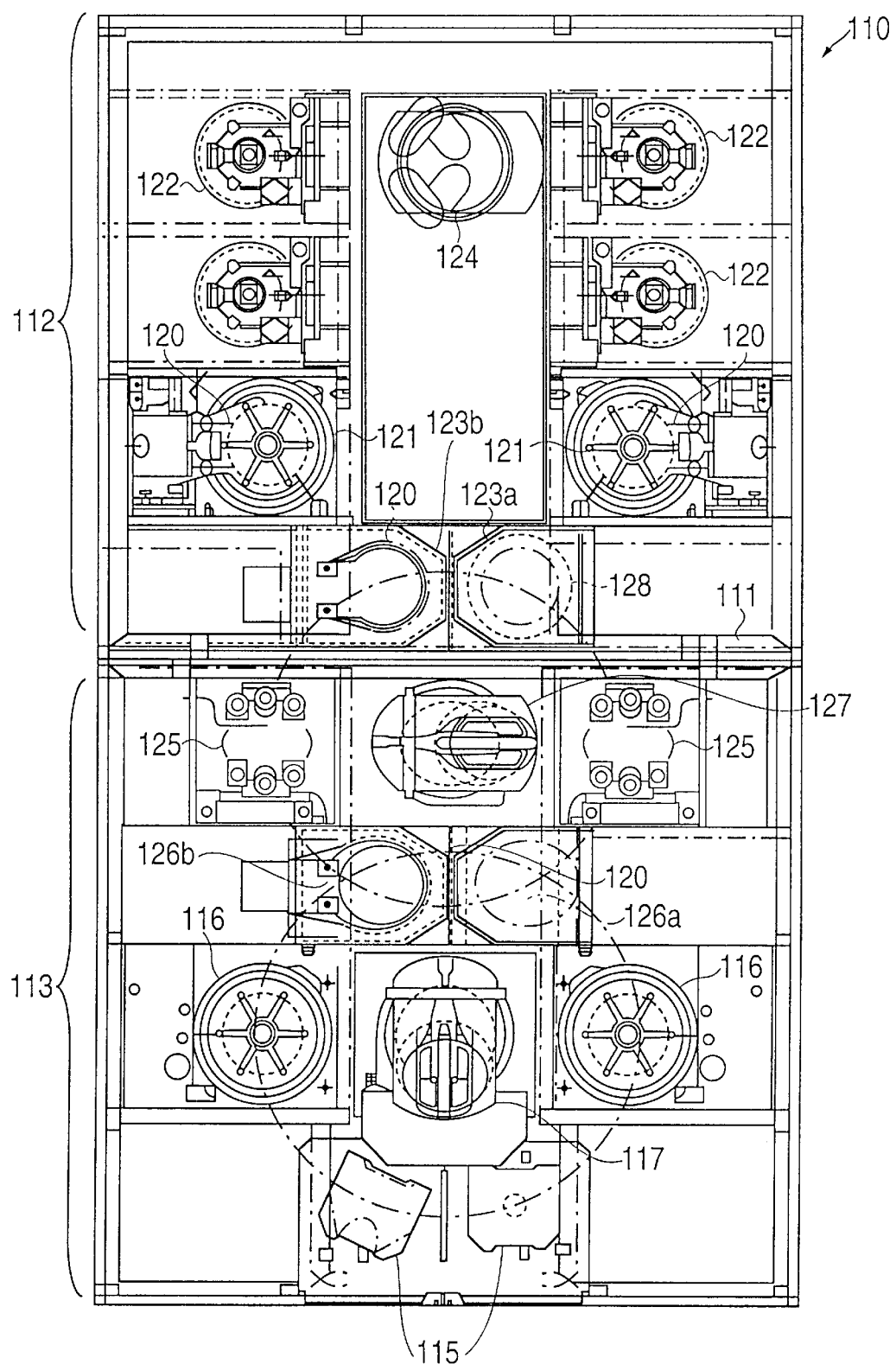
FIG. 11 is an entire structure of a plating apparatus having a substrate cleaning apparatus of this invention.

FIG. 11 shows an entire structure of a plating apparatus, having the aforementioned substrate cleaning apparatus 125, for plating a semiconductor substrate with copper. As shown in FIG. 11, the plating apparatus is disposed in a rectangular housing unit 110, and is constituted so as to continously plate a semiconductor substrate with copper. The housing unit 110 has a partition wall 111 for dividing the housing unit 110 into a plating section 112 and a cleaning section 113. Air can individually be supplied into and exhausted from each of the plating section 112 and the cleaning section 113. The partition wall 111 has a shutter (not shown) capable of opening and closing an opening in the partition wall. Pressure in the cleaning section 113 is lower than atmospheric pressure and higher than pressure in the plating section 112. This can prevent air in the cleaning section 113 from flowing out of the housing unit 110 and can prevent air in the plating section 112 from flowing into the cleaning section 113.

In the cleaning section 113, there are provided two cassette stages 115 for placing a substrate cassette thereon, and two cleaning and drying units 116 for cleaning (rinsing) a plated substrate with pure water and drying the substrate. Further, a rotatable fixed-type first transfer device (tetraxial robot) 117 for transferring a substrate is provided in the cleaning section 113. For example, each cleaning and drying unit 116 has a cleaning liquid supply nozzle for supplying ultrapure water to both surfaces of a substrate, and spins the substrate at a high speed to dewater and dry the substrate.

On the other hand, in the plating section 112, there are provided two pre-treatment units 121 for inverting a pretreated substrate with an inverter 120, four plating units 122 for plating a surface of a substrate with copper in such a state that a front surface of the substrate faces downwardly, and two first substrate stages 123a, 123b for holding a substrate placed thereon. Further, a rotatable mobile-type second transfer device (tetraxial robot) 124 for transferring a substrate is provided in the plating section 112.

In the cleaning section 113, there are provided two substrate cleaning apparatus 125 for cleaning a plated substrate by chemical liquid such as an acid solution or an oxidizing agent solution, and second substrate stages 126a, 126b located between the substrate cleaning apparatus 125 and the cleaning and drying units 116. A rotatable fixed-type third transfer device (tetraxial robot) 127 for transferring a substrate is provided between the two substrate cleaning apparatus 125.

One of the first substrate stages and one of the second substrate stages, i.e. the first substrate stage 123b and the second substrate stage 126b are constituted so as to clean the substrate with water. Each of the first substrate stage 123b and the second substrate stage 126b has an inverter 120.

Thus, the first transfer device 117 transfers a substrate among the cassettes placed on the cassette stages 115, the cleaning and drying units 116, and the second substrate stages 126a, 126b. The second transfer device 124 transfers a substrate among the first substrate stages 123a, 123b, the substrate cleaning apparatus 125, and the plating units 122. The third transfer device 127 transfers a substrate among the first substrate stages 123a, 123b, the substrate cleaning apparatus 125, and the second substrate stages 126a, 126b.

A container 128 for accommodating substrates for trial operation is disposed in the housing unit 110, and located below the first substrate stage 123a. The second transfer device 124 removes a substrate for trial operation from the container 128, and returns it to the container 128 after trial operation. Thus, by providing the container 128 for accommodating the substrates for trial operation in the housing unit 110, contamination or lowering of the throughput caused by introduction of the substrates for trial operation from the outside, when trial operation is performed, can be prevented.

As long as the substrates for trial operation can be removed from the container 128 or supplied into the container 128 by any transfer device, the container 128 may be placed anywhere in the housing unit 110. However, by placing the container 128 in the vicinity of the first substrate stage 123a, a trial operation can be conducted in such a manner that the substrate for the trial operation is pre-treated and plated, then cleaned and dried, and returned to the container 128.

The pre-treatment units 121 for improving attachment of a copper film to a surface of a substrate may not be provided. Further, one of the plating units, or one of the pre-treatment units, may be replaced with a pre-plating unit for reinforcing a seed layer formed on a surface of a substrate. In this case, the pre-treatment units are replaced with washing units for washing a substrate at a time between the pre-plating process and the plating process, and/or at a time after the plating process.

The transfer device 117 has two hands which are located in a vertically spaced relationship, wherein the upper hand is used for handling a dry substrate and the lower hand is used for handling a wet substrate. The transfer devices 124 and 127 have two recess support-type hands, respectively, for supporting a peripheral edge of a substrate by a recess, and these two hands are used for handling a wet substrate. The hands of the transfer devices are not limited to those types described above.

Next, a processing flow of the substrate in this embodiment will be described below.

Substrates are accommodated in a substrate cassette in such a state that a front surface of a substrate (surface on which elements are formed, i.e., surface to be processed) faces upwardly, and the substrate cassette accommodating such substrates is placed on the cassette stage 115. The first transfer device 117 removes the substrate from the substrate cassette, moves to the second substrate stage 126a, and places the substrate on the second substrate stage 126a. Then, the third transfer device 127 transfers the substrate from the second substrate stage 126a to the first substrate stage 123a. Thereafter, the second transfer device 124 receives the substrate from the first substrate stage 123a and transfers the substrate to pre-treatment unit 121. After pre-treatment of the substrate is completed in the pre-treatment unit 121, the substrate is inverted by inverter 120 to thus face the front surface of the substrate downwardly, and then the substrate is transferred to the second transfer device 124. Then, the second transfer device 124 transfers the substrate to a head of plating unit 122.

After plating of the substrate and removal of liquid on the substrate are performed in the plating unit 122, the substrate is transferred to the second transfer device 124 which transfers the substrate to the first substrate stage 123b. The substrate is inverted by inverter 120 located at the first substrate stage 123b to thus face the front surface upwardly, and then the substrate is transferred to substrate cleaning apparatus 125 by the third transfer device 127. In the substrate cleaning apparatus 125, the substrate is cleaned with chemical liquid, and rinsed with pure water, and then the liquid on the substrate is removed by spinning the substrate. Thereafter, the substrate is transferred to the first substrate stage 123b by the third transfer device 127. Next, the first transfer device 117 receives the substrate from the first substrate stage 123b, and transfers the substrate to cleaning and drying unit 116. In the cleaning and drying unit 116, the substrate is rinsed with pure water, and then spin-dried. The dried substrate is returned to the substrate cassette placed on cassette stage 115 by the first transfer device 117.

The pre-treatment may not be carried out in the pre-treatment unit. When a pre-plating unit is provided, a substrate removed from the cassette is plated in the plating unit with or without performing the washing process after performing the pre-plating process in the pre-plating unit, and the substrate is transferred to the first cleaning apparatus with or without performing the washing process after performing the plating process.

Although certain preferred embodiments of the present invention have been shown and described in detail, it should be understood that various changes and modifications be made therein without departing from the scope of the appended claims.

What is claimed is:

1. A method of removing a deposited metal from a peripheral portion of a surface of a substrate, comprising:
   rotating a substrate about an axis passing through said substrate; and
   while supplying an oxidizing agent solution only to a peripheral portion of a surface of said substrate, supplying a non-oxidizing acid solution to a central portion of said surface of said substrate such that, in response to rotation of said substrate about the axis passing therethrough, said non-oxidizing acid solution spreads from said central portion of said surface of said substrate to said peripheral portion of said surface of said substrate.

2. The method according to claim 1, wherein said metal is selected from the group consisting of copper, tungsten and ruthenium.

3. The method according to claim 1, further comprising:
   supplying an oxidizing agent solution and an acid solution to a reverse side of said substrate.

4. The method according to claim 3, wherein
   supplying an oxidizing agent solution to a reverse side of said substrate comprises supplying to said reverse side of said substrate an oxidizing agent solution that is the same as said oxidizing agent solution supplied only to said peripheral portion of said surface of said substrate.

5. The method according to claim 3, wherein
   supplying an acid solution to a reverse side of said substrate comprises supplying to said reverse side of said substrate an acid solution that is the same as said non-oxidizing acid solution supplied to said central portion of said surface of said substrate.

6. The method according to claim 1, wherein
   supplying a non-oxidizing acid solution to a central portion of said surface of said substrate comprises supplying said non-oxidizing acid solution to an area corresponding to at most 20% of a diameter of said surface of said substrate.

7. The method according to claim 1, wherein
   rotating said substrate about an axis passing through said substrate comprises rotating said substrate about a central axis of said substrate.

8. The method according to claim 1, wherein
   supplying a non-oxidizing acid solution to a central portion of said surface of said substrate comprises supplying to said central portion of said surface of said substrate a non-oxidizing acid solution selected from the group consisting of hydrochloric acid, hydrofluoric acid, sulfuric acid, citric acid and oxalic acid.

9. The method according to claim 1, wherein
   supplying an oxidizing agent solution only to a peripheral portion of a surface of said substrate comprises supplying only to said peripheral portion of said surface of said substrate an oxidizing agent solution selected from the group consisting of ozone, hydrogen peroxide, nitric acid and hypochlorous acid.

10. A method of removing a deposited metal from a peripheral portion of a surface of a substrate, comprising:
    rotating a substrate about an axis passing through said substrate;
    ejecting an oxidizing agent solution from a first nozzle only to a peripheral portion of a surface of said substrate; and
    ejecting a non-oxidizing acid solution from a second nozzle to a central portion of said surface of said substrate such that, in response to rotation of said substrate about the axis passing therethrough, said non-oxidizing acid solution spreads from said central portion of said surface of said substrate to said peripheral portion of said surface of said substrate.

11. The method according to claim 10, wherein at least one of said first nozzle and said second nozzle is adjustable in a direction toward and away from said surface of said substrate, and is also angularly adjustable with respect to said surface of said substrate.

12. The method according to claim 10, wherein said metal is selected from the group consisting of copper, tungsten and ruthenium.

13. The method according to claim 10, further comprising:
    supplying an oxidizing agent solution and an acid solution to a reverse side of said substrate.

14. The method according to claim 13, wherein
    supplying an oxidizing agent solution to a reverse side of said substrate comprises supplying to said reverse side of said substrate an oxidizing agent solution that is the same as said oxidizing agent solution ejected from said first nozzle only to said peripheral portion of said surface of said substrate.

15. The method according to claim 13, wherein
    supplying an acid solution to a reverse side of said substrate comprises supplying to said reverse side of said substrate an acid solution that is the same as said non-oxidizing acid solution ejected from said second nozzle to said central portion of said surface of said substrate.

16. The method according to claim 10, wherein
ejecting a non-oxidizing acid solution from a second nozzle to a central portion of said surface of said substrate comprises ejecting said non-oxidizing acid solution from said second nozzle to an area corresponding to at most 20% of a diameter of said surface of said substrate.

17. The method according to claim 10, wherein
rotating said substrate about an axis passing through said substrate comprises rotating said substrate about a central axis of said substrate.

18. The method according to claim 10, wherein
ejecting a non-oxidizing acid solution from a second nozzle to a central portion of said surface of said substrate comprises ejecting from said second nozzle to said central portion of said surface of said substrate a non-oxidizing acid solution selected from the group consisting of hydrochloric acid, hydrofluoric acid, sulfuric acid, citric acid and oxalic acid.

19. The method according to claim 10, wherein
ejecting an oxidizing agent solution from a first nozzle only to a peripheral portion of a surface of said substrate comprises ejecting from said first nozzle only to said peripheral portion of said surface of said substrate an oxidizing agent solution selected from the group consisting of ozone, hydrogen peroxide, nitric acid and hypochlorous acid.

20. The method according to claim 10, wherein
ejecting an oxidizing agent solution from a first nozzle only to a peripheral portion of a surface of said substrate and ejecting a non-oxidizing acid solution from a second nozzle to a central portion of said surface of said substrate comprises ejecting said oxidizing agent solution from said first nozzle only to said peripheral portion of said surface of said substrate simultaneously with ejecting said non-oxidizing acid solution from said second nozzle to said central portion of said surface of said substrate.

21. A method of depositing metal onto a surface of a substrate and removing a portion of the deposited metal from a peripheral portion of the surface of the substrate, comprising:
transferring a substrate to a plating unit;
in said plating unit, plating metal onto a surface of said substrate;
transferring the plated substrate from said plating unit to a cleaning unit; and
in said cleaning unit
(i) rotating said substrate about an axis passing through said substrate,
(ii) supplying an oxidizing agent solution only to a peripheral portion of the plated surface of said substrate, and
(iii) supplying a non-oxidizing acid solution to a central portion of the plated surface of said substrate such that, in response to rotation of said substrate about the axis passing therethrough, said non-oxidizing acid solution spreads from said central portion of the plated surface of said substrate to said peripheral portion of the plated surface of said substrate.

22. The method according to claim 21, wherein
plating metal onto a surface of said substrate comprises plating onto said surface of said substrate a metal selected from the group consisting of copper, tungsten and ruthenium.

23. The method according to claim 21, further comprising:
supplying an oxidizing agent solution and an acid solution to a reverse side of said substrate.

24. The method according to claim 23, wherein
supplying an oxidizing agent solution to a reverse side of said substrate comprises supplying to said reverse side of said substrate an oxidizing agent solution that is the same as said oxidizing agent solution supplied only to said peripheral portion of the plated surface of said substrate.

25. The method according to claim 23, wherein
supplying an acid solution to a reverse side of said substrate comprises supplying to said reverse side of said substrate an acid solution that is the same as said non-oxidizing acid solution supplied to said central portion of the plated surface of said substrate.

26. The method according to claim 21, wherein
supplying a non-oxidizing acid solution to a central portion of the plated surface of said substrate comprises supplying said non-oxidizing acid solution to an area corresponding to at most 20% of a diameter of the plated surface of said substrate.

27. The method according to claim 21, wherein
rotating said substrate about an axis passing through said substrate comprises rotating said substrate about a central axis of said substrate.

28. The method according to claim 21, wherein
supplying a non-oxidizing acid solution to a central portion of the plated surface of said substrate comprises supplying to said central portion of the plated surface of said substrate a non-oxidizing acid solution selected from the group consisting of hydrochloric acid, hydrofluoric acid, sulfuric acid, citric acid and oxalic acid.

29. The method according to claim 21, wherein
supplying an oxidizing agent solution only to a peripheral portion of the plated surface of said substrate comprises supplying only to said peripheral portion of the plated surface of said substrate an oxidizing agent solution selected from the group consisting of ozone, hydrogen peroxide, nitric acid and hypochlorous acid.

30. The method according to claim 21, wherein
supplying an oxidizing agent solution only to a peripheral portion of the plated surface of said substrate and supplying a non-oxidizing acid solution to a central portion of the plated surface of said substrate comprises supplying said oxidizing agent solution only to said peripheral portion of the plated surface of said substrate simultaneously with supplying said non-oxidizing acid solution to said central portion of the plated surface of said substrate.

* * * * *